US007038234B2

United States Patent
Ghamaty et al.

(10) Patent No.: US 7,038,234 B2
(45) Date of Patent: May 2, 2006

(54) THERMOELECTRIC MODULE WITH SI/SIGE AND B4C/B9C SUPER-LATTICE LEGS

(75) Inventors: Saeid Ghamaty, La Jolla, CA (US); Norbert B. Elsner, La Jolla, CA (US); John C. Bass, La Jolla, CA (US)

(73) Assignee: Hi-Z Technology, Inc., San Diego, CA (US)

( * ) Notice: Subject to any disclaimer, the term of this patent is extended or adjusted under 35 U.S.C. 154(b) by 0 days.

(21) Appl. No.: 10/818,028

(22) Filed: Apr. 5, 2004

(65) Prior Publication Data

US 2005/0040388 A1     Feb. 24, 2005

Related U.S. Application Data

(63) Continuation-in-part of application No. 10/021,097, filed on Dec. 12, 2001, now Pat. No. 6,828,579.

(60) Provisional application No. 60/460,057, filed on Apr. 3, 2003.

(51) Int. Cl.
*H01L 29/09* (2006.01)
*H01L 31/328* (2006.01)
*H01L 31/336* (2006.01)
*H01L 31/72* (2006.01)
*H01L 31/109* (2006.01)

(52) U.S. Cl. ............................. 257/15; 257/9; 257/16; 257/17; 257/18; 257/19; 257/20; 257/21; 257/22; 257/28; 257/110; 257/120; 257/548; 257/930

(58) Field of Classification Search ............... 257/9, 257/15–22, 28, 110, 120, 548, 930
See application file for complete search history.

(56) References Cited

U.S. PATENT DOCUMENTS

| 3,851,381 | A | * | 12/1974 | Alais et al. .................... 438/55 |
| 5,415,699 | A | * | 5/1995 | Harman .................... 136/238 |
| 5,436,467 | A | * | 7/1995 | Elsner et al. .................. 257/15 |
| 5,817,188 | A | * | 10/1998 | Yahatz et al. ............... 136/237 |
| 5,875,098 | A | * | 2/1999 | Leavitt et al. .............. 361/708 |
| 5,900,071 | A | * | 5/1999 | Harman ................... 136/236.1 |
| 5,921,087 | A | * | 7/1999 | Bhatia et al. ................. 62/3.2 |
| 5,952,728 | A | * | 9/1999 | Imanishi et al. .............. 62/3.2 |
| 6,002,081 | A | * | 12/1999 | Sakuragi ..................... 136/203 |
| 6,019,098 | A | * | 2/2000 | Bass et al. ................... 126/344 |
| 6,060,656 | A | * | 5/2000 | Dresselhaus et al. ....... 136/205 |
| 6,094,919 | A | * | 8/2000 | Bhatia .......................... 62/3.7 |

(Continued)

*Primary Examiner*—Ida M. Soward
(74) *Attorney, Agent, or Firm*—John R. Ross; John R. Ross, III

(57) ABSTRACT

A super-lattice thermoelectric device. The device includes p-legs and n-legs, each leg having a large number of alternating layers of two materials with differing electron band gaps. The n-legs in the device are comprised of alternating layers of silicon and silicon germanium. The p-legs includes alternating layers of $B_4C$ and $B_9C$. In preferred embodiments the layers are about 100 angstroms thick. Applicants have fabricated and tested a first Si/SiGe (n-leg) and $B_4C/B_9C$ (p-leg) quantum well thermocouple. Each leg was only 11 microns thick on a 5 micron Si substrate. Nevertheless, in actual tests the thermocouple operated with an amazing efficiency of 14 percent with a $T_h$ of 250 degrees C. Thermoelectric modules made according to the present invention are useful for both cooling applications as well as electric power generation. This preferred embodiment is a thermoelectric 10×10 egg crate type module about 6 cm×6 cm×0.76 cm designed to produce 70 Watts with a temperature difference of 300 degrees C with a module efficiency of about 30 percent.

13 Claims, 9 Drawing Sheets

U.S. PATENT DOCUMENTS

| | | | |
|---|---|---|---|
| 6,096,965 A * | 8/2000 | Ghamaty et al. | 136/201 |
| 6,207,887 B1 * | 3/2001 | Bass et al. | 136/201 |
| 6,226,994 B1 * | 5/2001 | Yamada et al. | 62/3.7 |
| 6,252,154 B1 * | 6/2001 | Kamada et al. | 136/201 |
| 6,313,392 B1 * | 11/2001 | Sato et al. | 136/201 |
| 6,519,947 B1 * | 2/2003 | Bass et al. | 62/3.2 |
| 6,521,991 B1 * | 2/2003 | Yamada et al. | 257/712 |
| 6,727,423 B1 * | 4/2004 | Tauchi et al. | 136/201 |
| 6,828,579 B1 * | 12/2004 | Ghamaty et al. | 257/15 |
| 2002/0024154 A1 * | 2/2002 | Hara et al. | 257/930 |
| 2003/0042497 A1 * | 3/2003 | Span | 257/121 |
| 2004/0128041 A1 * | 7/2004 | Hiller et al. | 701/40 |
| 2004/0238022 A1 * | 12/2004 | Hiller et al. | 136/203 |
| 2005/0028857 A1 * | 2/2005 | Ghamaty et al. | 136/204 |

* cited by examiner

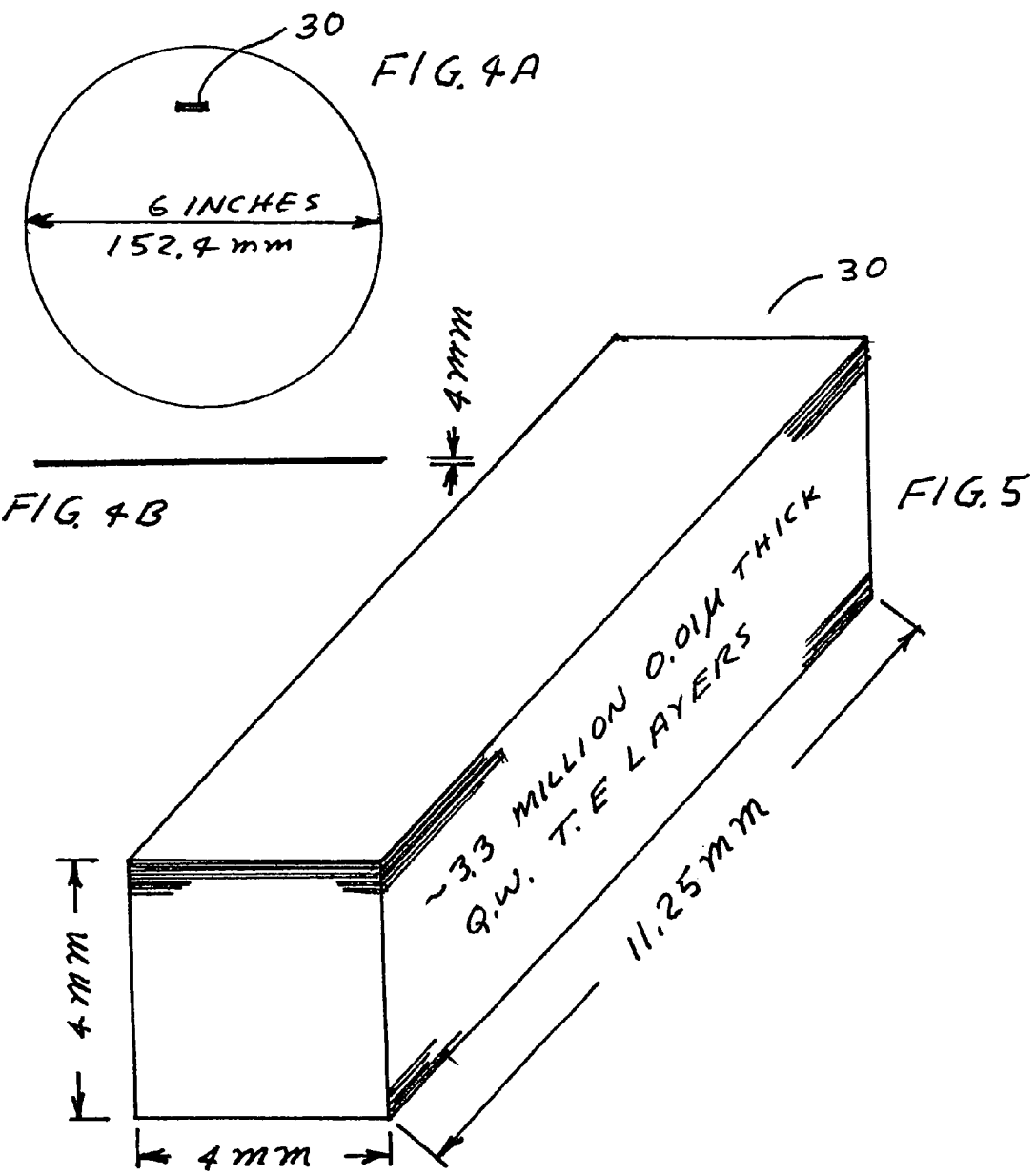

THERMOELECTRIC MODULE WITH SI/SIGE AND B4C/B9C SUPER-LATTICE LEGS

This invention was made in the course of contracts with agencies of the United States government and the government has rights in this invention. This Application is a continuation in part of U.S. patent application Ser. No. 10/021,097, filed Dec. 12, 2001, now U.S. Pat. No. 6,828,579 and also claims the benefit of Provisional Application Serial No. 60/460,057 filed Apr. 3, 2003. The present invention relates to thermoelectric devices and in particular to very thin lattice thermoelectric devices.

BACKGROUND OF THE INVENTION

Workers in the thermoelectric industry have been attempting too improve performance of thermoelectric devices for the past 20–30 years with not much success. Most of the effort has been directed to reducing the lattice thermal conductivity (K) without adversely affecting the electrical conductivity. Experiments with super-lattice quantum well materials have been underway for several years. These materials were discussed in an paper by Gottfried H. Dohler which was published in the November 1983 issue of Scientific American. This article presents an excellent discussion of the theory of enhanced electric conduction in super-lattices. These super-lattices contain alternating conducting and barrier layers and create quantum wells that improve electrical conductivity. These super-lattice quantum well materials are crystals grown by depositing semiconductors in layers whose thicknesses is in the range of a few to up to about 100 angstroms. Thus, each layer is only a few atoms thick. (These quantum well materials are also discussed in articles by Hicks, et al and Harman published in Proceedings of 1992 1st National Thermoelectric Cooler Conference Center for Night Vision & Electro Optics, U.S. Army, Fort Belvoir, Va. The articles project theoretically very high ZT values as the layers are made progressively thinner.) The idea being that these materials might provide very great increases in electric conductivity without adversely affecting Seebeck coefficient or the thermal conductivity. Harmon of Lincoln Labs, operated by MIT has claimed to have produced a super-lattice of layers of (Bi,Sb) and Pb(Te,Se). He claims that his preliminary measurements suggest ZTs of 3 to 4. FIG. 1 shows theoretical calculated values (Sun et al—1998) of ZT plotted as a function of quantum well width.

The present inventors have demonstrated that high ZT values can definitely be achieved with $Si/Si_{0.8}Ge_{0.2}$ super-lattice quantum well. (See, for example, U.S. Pat. No. 5,550,387.) The present inventors have had issued to them United States patents in 1995 and 1996 which disclose such materials and explain how to make them. These patents (which are hereby incorporated by reference herein) are U.S. Pat. Nos. 5,436,467, 5,550,387. FIGS. 1A and 1B herein were FIGS. 3 and 5 of the '467 patent. A large number of very thin layers (in the '467 patent, about 250,000 layers) together produce a thermoelectric leg 10 about 0.254 cm thick. In the embodiment shown in the figures all the legs are connected electrically in series and otherwise are insulated from each other in an egg-crate type thermoelectric element as shown in FIG. 1A. As shown in FIG. 1B current flows from the cold side to the hot side through P legs and from the hot side to the cold side through N legs. (Electrons flow in the opposite direction.) These patents disclose super-lattice layers comprised of: (1) SiGe as conducting layer and Si as a barrier layer and (2) alternating layers of two different alloys of boron carbide. In the '387 patent Applicants disclose that they had discovered that strain in the layers can have very beneficial effects on thermoelectric properties of the elements disclosed in the '467 patent.

U.S. Pat. Nos. 6,096,964 and 6,096,965 disclose techniques for making thermoelectric elements by depositing thin alternating layers of semi-conductor material and barrier layers on very thin substrates to create quantum wells. All of the above-cited patents are incorporated herein by reference.

What are needed are improved thermoelectric devices that can be produced efficiently for practical application.

SUMMARY OF THE INVENTION

The present invention provides a super-lattice thermoelectric device. The device is comprised of p-legs and n-legs, each leg being comprised of a large number of alternating layers of two materials with differing electron band gaps. The n-legs in the device are comprised of alternating layers of silicon and silicon germanium. The p-legs are comprised of alternating layers of $B_4C$ and $B_9C$. In preferred embodiments the layers are about 100 angstroms thick. Applicants have fabricated and tested a first Si/SiGe (n-leg) and $B_4C/B_9C$ (p-leg) quantum well thermocouple. Each leg was only 11 microns thick on a 5 micron Si substrate. Nevertheless, in actual tests operated the couple operated with an amazing efficiency of 14 percent with a $T_h$ of 250 degrees C. Thermoelectric modules made according to the present invention are useful for both cooling applications as well as electric power generation. This preferred embodiment is a thermoelectric 10×10 egg crate type module about 6 cm×6 cm×0.76 cm designed to produce 70 Watts with a temperature difference of 300 degrees C. with a module efficiency of about 30 percent. The module has 98 active thermoelectric legs, with each leg having more than 3 million super-lattice layers. The n-legs are alternating layers of Si/SiGe and the p-layers are alternating layers of $B_4C/B_9C$.

BRIEF DESCRIPTION OF THE DRAWINGS

FIG. 4A is a top view and FIG. 4B is a side view of the stack of films of thermoelectric layers.

FIG. 5 shows a thermoelectric leg cut from the stack of films of thermoelectric layers.

DETAILED DESCRIPTION OF PREFERRED EMBODIMENTS

Applicants' Experiments

Figure 9:
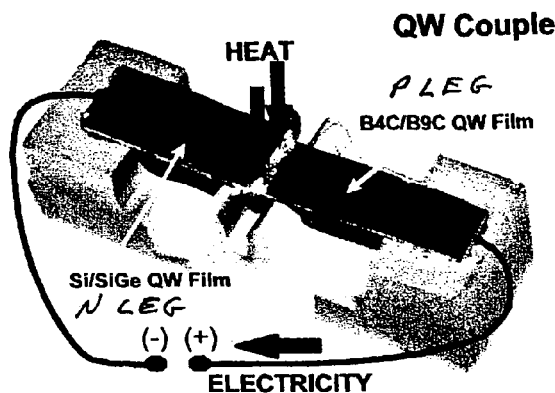
FIG. 9 shows a test stet-up.
Figure 10:
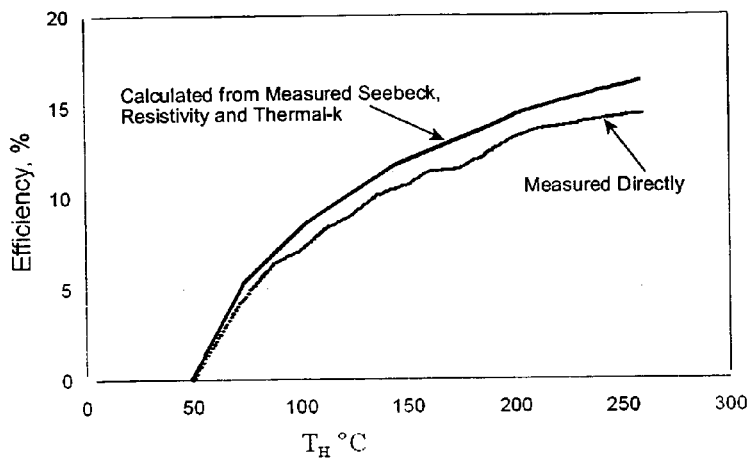
FIG. 10 shows test results.

Applicants have produced a test quantum well thermoelectric couple with 11 microns of thermoelectric layers on a 5-micron silicon film that has operated at 14 percent conversion efficiency. This efficiency was calculated by dividing the power out of the couple by the power in to an electric heater with no correction for extraneous heat losses. The accuracy of the experimental set-up used was validated by measurement of the 5 percent efficiency of a couple fabricated of bulk $Bi_2Te_3$ alloys. The test set-up is shown in FIG. 9 and the results are shown in FIG. 10.

Figure of Merit

The thermodynamic efficiency, η, for a thermoelectric power generator is given by:

$$\eta = \{(T_h - T_c)/T_h\}\{(M-1)/(M + T_c/T_h)\}$$

where M is defined by $$M = \{1 + Z(T_c + T_h)/2\}$$

Figure 11:
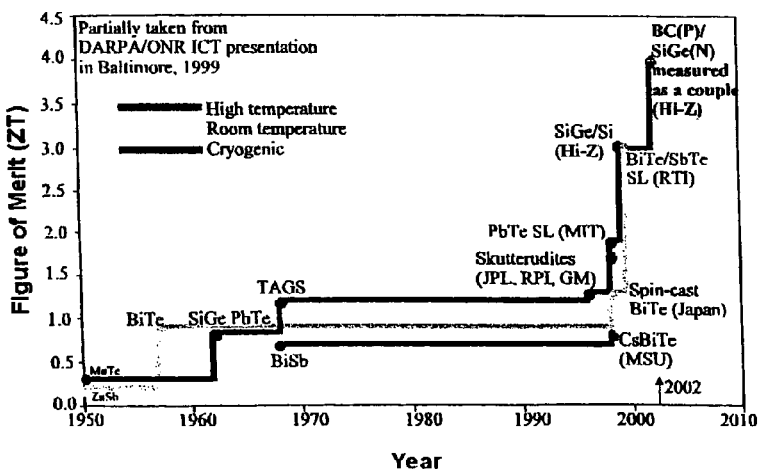
FIG. 11 shows thermoelectric progress over the past 54 years.

For a specific thermoelectric material, the figure of merit, Z, must be high:

$$Z = \sigma\alpha^2/K_L K_e$$

where σ is the electrical conductivity, α is the Seebeck coefficient, $k_L$ is the lattice or phonon contribution to the thermal conductivity and $K_e$ is the electron contribution to the thermal conductivity. For good efficiency Z must be high. Much effort has been expended to increase the figure without much success until the past few years as indicated in FIG. 11 that shows ZT improvements. Applicants' discoveries have been important in bringing about these improvements as indicated in FIG. 11 and also in Applicant's patents cited in the Background section. In 2002 Applicants demonstrated ZT values of about 4.0 and measured actual efficiencies of about 14 percent with Si/SiGe n-legs and $B_4C/B_9C$ p-legs. Each leg was only 11 microns thick on a 5 micron Si substrate.

First Preferred Embodiment $B_4C/B_9C$ and Si/Si/Ge Super-Lattice Module

In this first preferred embodiment thermoelectric elements are made with p-type legs comprised of super-lattices of alternating layers of $B_4C$ and $B_9C$ and n-type legs comprised of a super-lattices of alternating layers of Si and SiGe. The $B_4C/B_9C$ legs (as a p-legs) functions as thermoelectric elements without added doping. The SiGe is n-doped at $10^{18}$ to $10^{20}$/mole.

Materials and Equipment for Producing Thermoelectric Film

The following special materials and equipment are needed to produce thermoelectric film for this first preferred embodiment:
1) Silicon sputtering targets of approximate size of 10×12 inches.
2) $SiO_{0.8}Ge.2$ doped n-type ($10^{18}$ to $10^{20}$/mole) sputtering targets of approximate size of 10×12 inches.
3) $B_4C/B_9C$ sputtering targets of approximate size of 10×12 inches.
4) A large number of 5-micron thick p-doped and n-doped Si substrate wafers approximately 6 inches in diameter.
5) A sputtering machine with at least 62 inch diameter vacuum chamber, with three direct current sputtering magnetometers, and all the typical supporting instrumentation, such as vacuum pumps, power supplies, monitoring instruments, etc. These machines are available from several suppliers such as AJA International, Inc.
6) Substrate holders with heating elements for heating substrates to 1000 degrees C.
7) Measuring equipment for measuring alternating current resistivity, Seebeck coefficient, and thermal conductivity.
8) Cutting equipment for cutting finished film or stacks of film to desired shapes.
9) Tools for assembling quantum well thermoelectric modules into completed egg crate assemblies.

Fabrication of Si/SiGe Quantum Well Thermoelectric Film

Figure 1A:
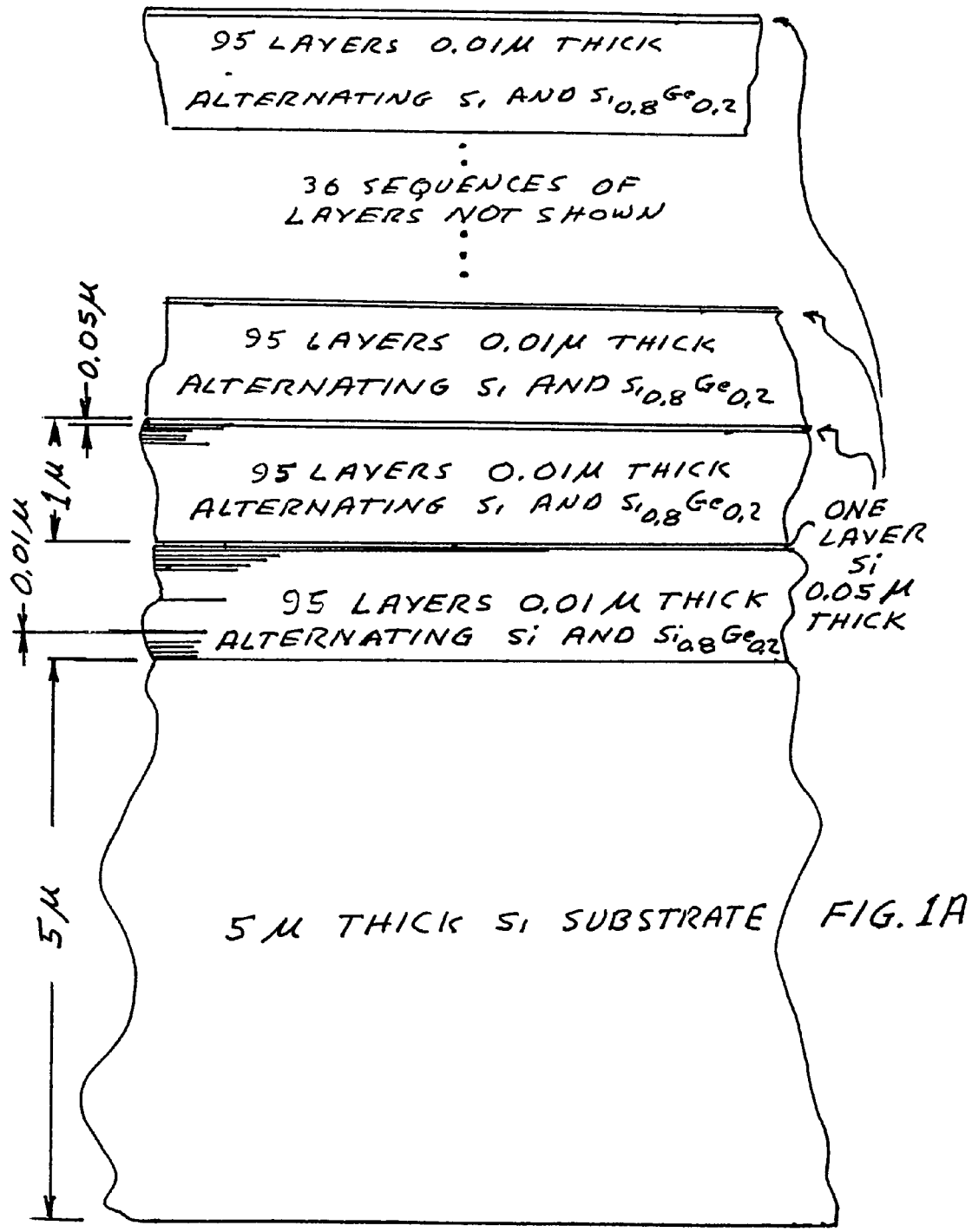
FIGS. 1A and 1B, and 2A and 2B are cross-sections of films of thermoelectric layers.
Figure 2A:
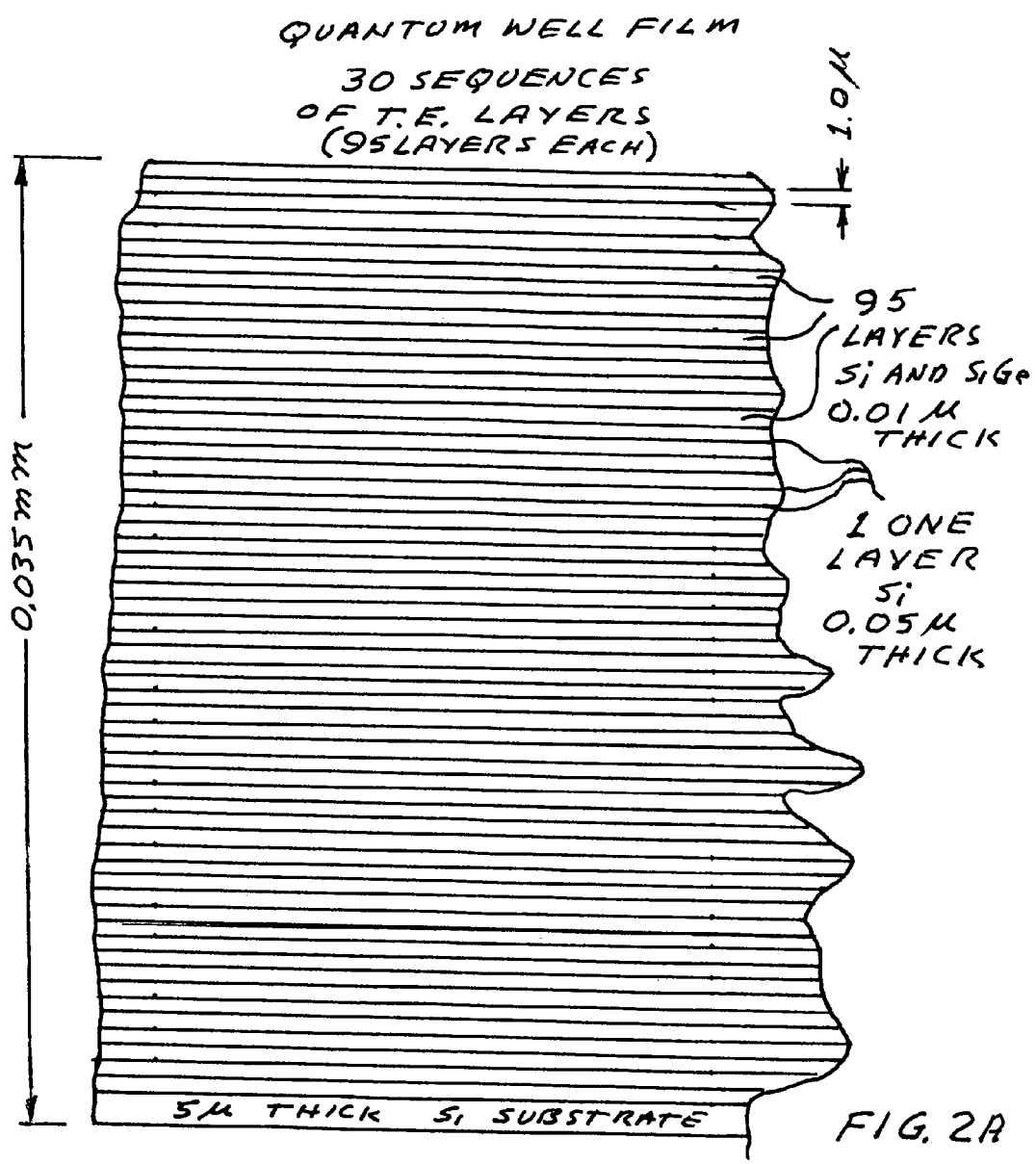
Figure 8:
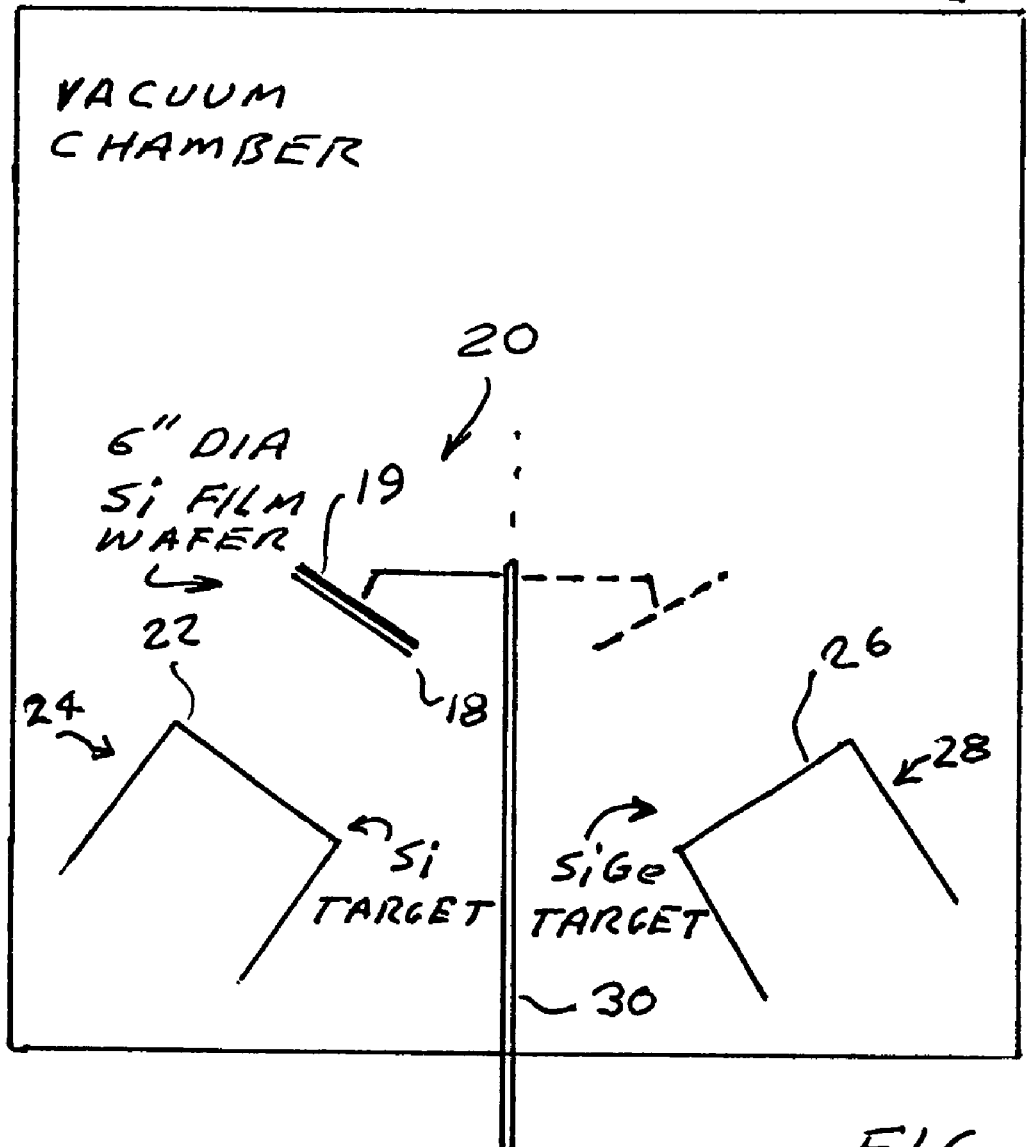
FIG. 8 show a preferred technique for producing the films of thermoelectric layers.

FIG. 8 is a drawing of the primary elements of a DC sputtering magnetometer set up to produce Si/SiGe thermoelectric film. One of the 5 micron thick n-doped silicon wafers which will function as a silicon substrate 18 is placed on a graphite holder 19 as shown at 20 in FIG. 8A. One of the Silicon targets 22 is placed on high voltage target holder 24 and a SiGe target 26 is placed on high voltage target holder 28. The targets are maintained at 800 volts with a current of about 0.1 amps. The sputtering chamber is a brought to a vacuum of about 15–20 microns of Hg with a pure argon environment. Argon ions bombard the targets releasing target atoms from target 22 that collect on the substrate 18. The substrate 18 should be maintained at a temperature of about 375 degrees C to help balance out stresses that otherwise tend to develop in the deposited film. The sputtering magnetometer is operated so as to deposit 100-Angstrom (0.1 micron) layers on substrate 18 at the rate of about one layer per minute. After the first silicon layer is deposited, substrate holder is pivoted so that substrate 18 is positioned over SiGe target 26 and a 100-Angstrom layer of SiGe is deposited on top of the 100-Angstrom silicon layer. This process is repeated until 95 layers 100 Angstrom layers have been deposited on substrate 18. Then a 500-Angstrom layer of silicon is deposited on top of the 95 layers to produce a sequence of layers 1.0-micron thick as shown in FIG. 1A. This sequence is then repeated 29 times as shown in FIGS. 1A and 2A until 30 sequences of layers have been deposited to produce a film 6 inches in diameter with a total thickness of 0.035 mm (35 microns). The film has 2,850 thermoelectric quantum well layers each about 100 Angstroms thick. After fabrication the film preferably should be checked for thermoelectric properties including resistivity, Seebeck coefficient and thermal conductivity. The figure of merit should be about 0.01 (1/K) or better.

Making Si/SiGe Thermoelectric Legs

Figure 3:
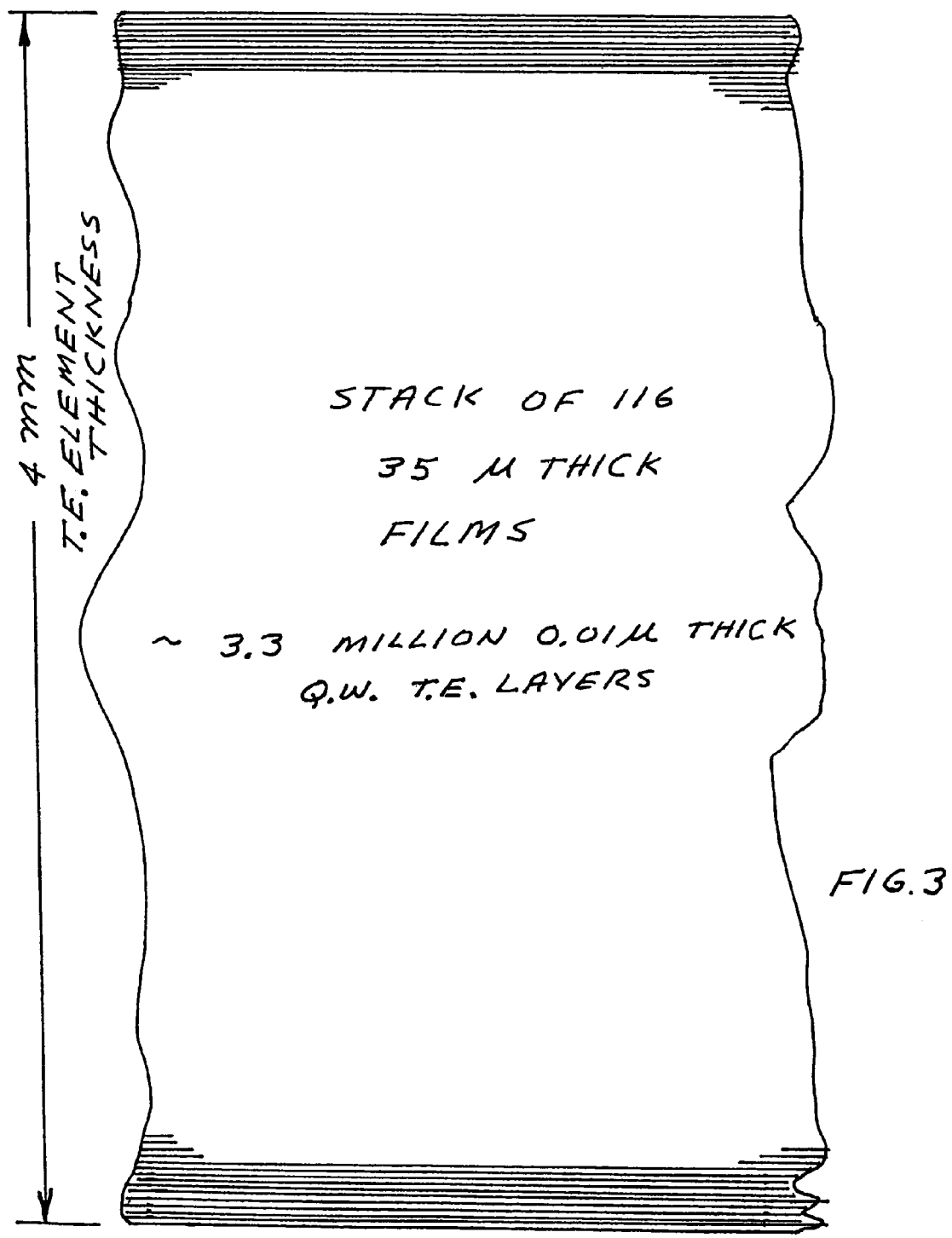
FIG. 3 shows a cross section of a stack of films of thermoelectric layers.

To produce Si/SiGe legs for the thermoelectric module for this embodiment, stacks of 116 films are required. So the process described above is repeated until the required quantity of film is produced. The film is then stacked as indicated in FIGS. 3, 4A and 4B to produce a stack 4-mm thick. An adhesive such as super glue (which dissipates when heated) can be used to hold the layers together. Si/SiGe thermoelectric legs with dimensions 4 mm×4 mm×11.25 mm are then cut from this stack as shown 30 in FIG. 5 and FIG. 4A. A diamond saw can be used or the legs can be cut with a laser cutter. A total of 49 Si/SiGe legs are need for one 70-Watt module. The silicon substrate for the n-legs should be n-doped.

B₄C/B₉C Thermoelectric Legs

Figure 1B:
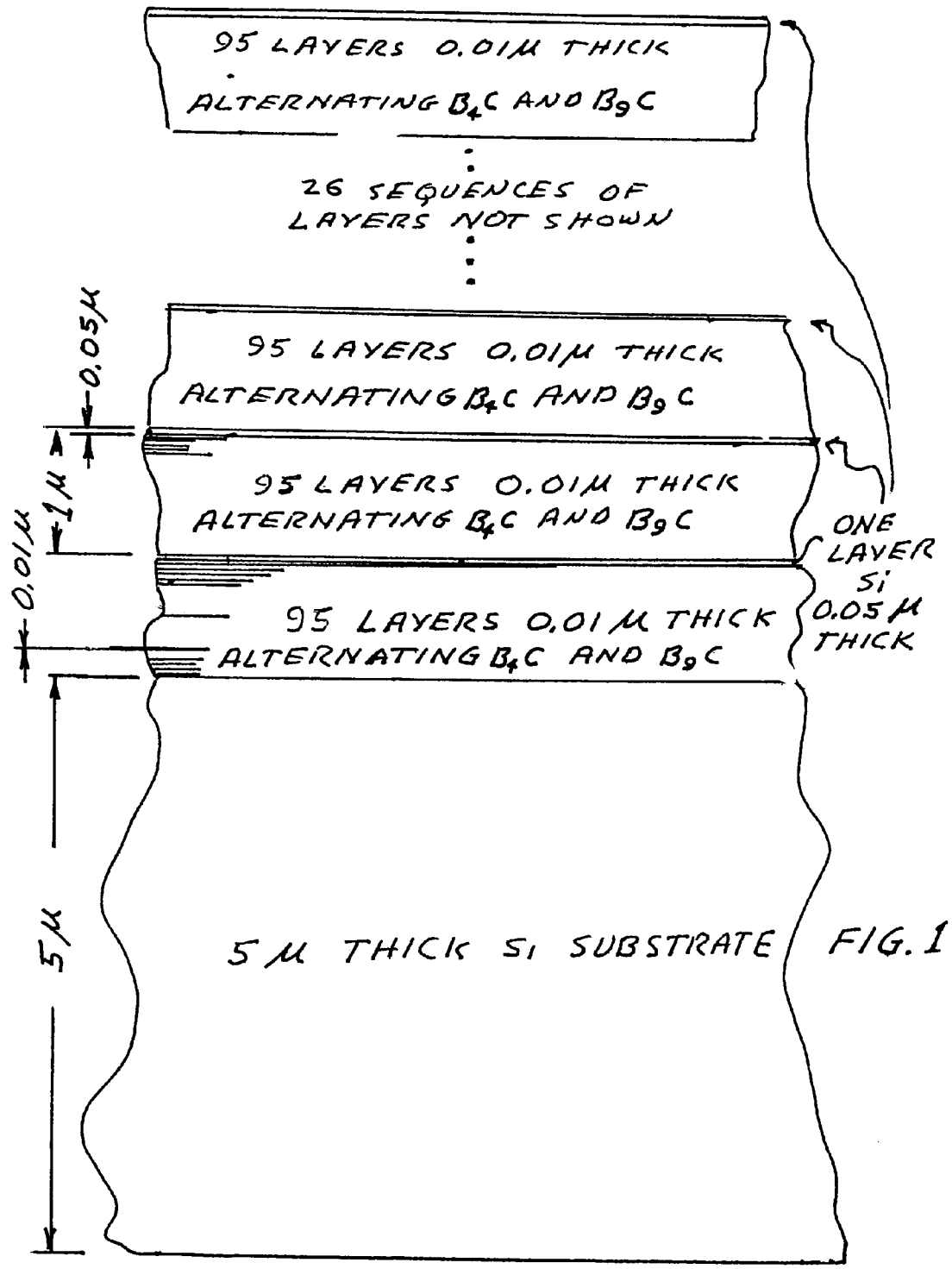
Figure 2B:
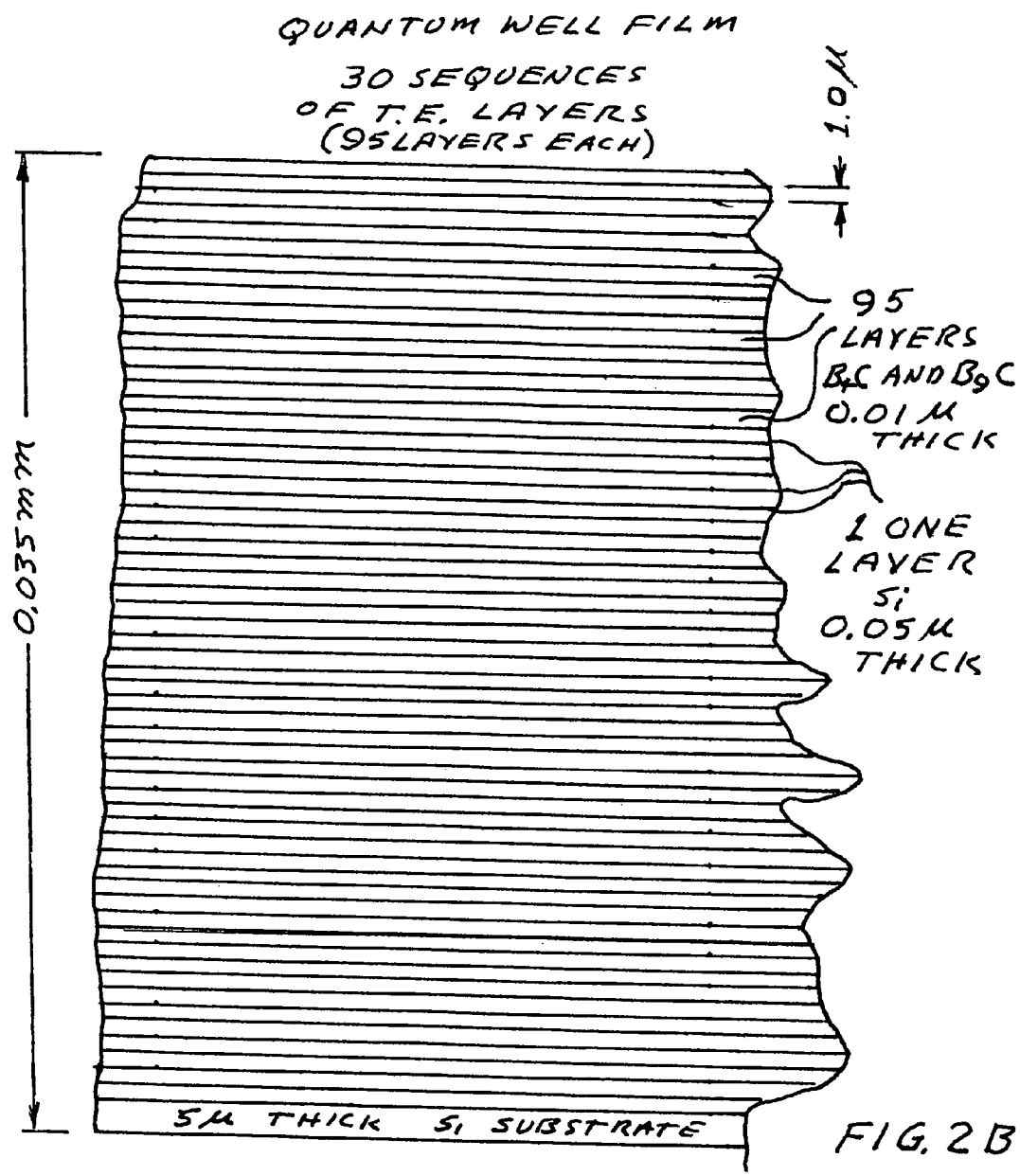

B₄C/B₉C legs for this thermoelectric module are produced with the same procedure described above except B₄C replaces the silicon as target material and as thermoelectric layers. The substrate however is silicon and the 0.05 micron silicon layer between sequences of layers is also silicon, all as shown in FIGS. 1B and 2B. For these legs the third target structure of the sputtering magnetometer (not shown in FIG. 8) is utilized so that the silicon layers can be provided in addition to the B₄C and B₉C thermoelectric layers.

Module Fabrication

Figure 6:
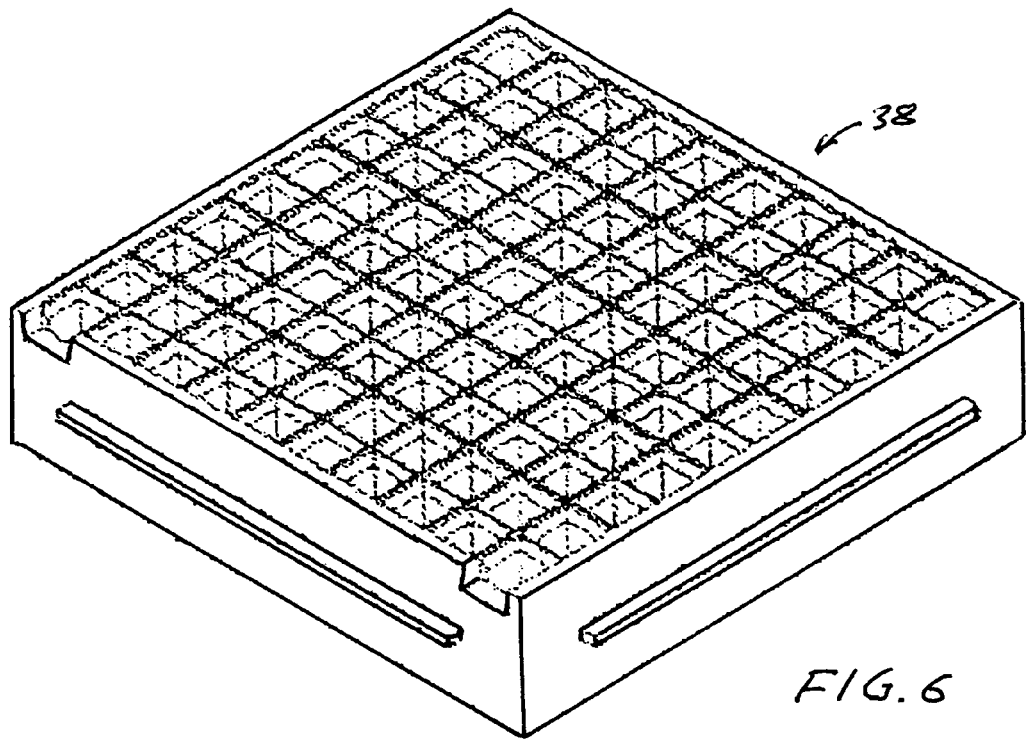
FIG. 6 shows an egg crate for holding 100 of the thermoelectric legs to form a thermoelectric module.
Figure 7:
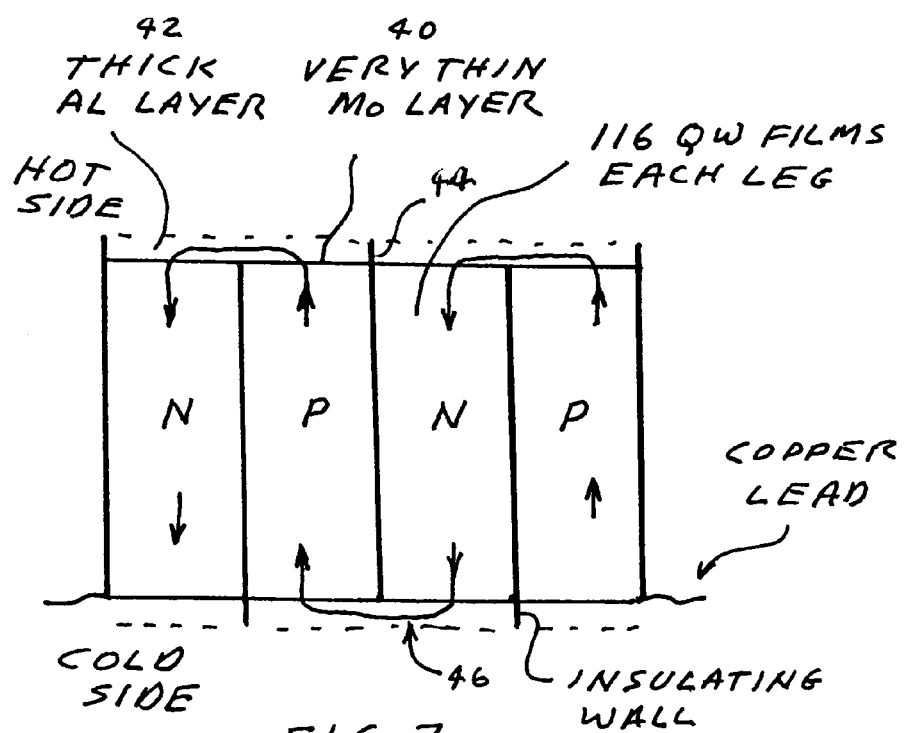
FIG. 7 shows the path of current through the legs of the thermoelectric module.

The 98 legs prepared as described above for this embodiment should now be loaded into thermoelectric egg crates of the type well known in the thermoelectric art. One such egg crate is shown at 38 in FIG. 6. The egg crate provides insulated slots for 100 legs. Two slots are used for copper lead connections and to provide support for the leads, these slots are preferably filled with a bulk material the same as the material in the adjacent connected slot. Preferably a very thin molybdenum layer is deposited on exposed surfaces of the legs as shown at 40 in FIG. 7 and aluminum is sprayed as shown at 42 on both the hot and cold sides of the module to connect all of the legs in series. After spraying the aluminum is ground down to the insulating wall 44 to isolate each leg from all other legs except one leg at the module cold side and one leg at the module hot side. The direction of current flow is shown at 46 in FIG. 7.

Operation

The completed module has dimensions of about 6 cm×6 cm×1.4 cm and is designed to produce 70 Watts at a temperature difference of 300 degrees C. with a heat flux of 10 W/cm2. The modules are useful for waste heat recovery, auxiliary power units, self-powered engine heaters, space power, and low temperature detector cooling. Applicants estimate high volume cost of these modules at $0.20/Watt to $0.50/Watt compared to about $1/Watt for conventional bulk thermoelectric modules.

Substrates

Substrates for Super-Lattice Thermoelectric Material

As described in U.S. Pat. Nos. '467, '387, '964 and '965, quantum well thermoelectric material is preferably deposited in layers on substrates. For a typical substrate as described in those patents, heat loss through the substrate can greatly reduce the efficiency of a thermoelectric device made from the material. If the substrate is removed some of the thermoelectric layers could be damaged and even if not damaged the process of removal of the substrate could significantly increase the cost of fabrication of the devices. The present invention provides a substrate that can be retained. The substrate preferably should be very thin with a low thermal and electrical conductivity with good thermal stability and strong and flexible.

Silicon

Silicon is the preferred substrate material for depositing the Si/SiGe and B₄C/B₉C layers. Si is available commercially in films as thin as 5 microns from suppliers such as Virginia Simi-conductor with offices in Fredricksburg, Va. By using a 5-micron substrate the amount of bypass heat loss can be held to a minimum. For commercial applications the quantum well film will be approximately 35 microns thick as explained above. Thus the ratio of quantum well thickness to substrate thickness is more than sufficient to greatly minimize by-pass heat losses. The silicon film is stable at much higher temperatures than Kapton.

Kapton®

Kapton is a Product of DuPont Corporation. According to DuPont Bulletins:

Kapton® polyimide film possesses a unique combination of properties that make it ideal for a variety of applications in many different industries. The ability of Kapton® to maintained its excellent physical, electrical, and mechanical properties over a wide temperature range has opened new design and application areas to plastic films.

Kapton® is synthesized by polymerizing an aromatic dianhydride and an aromatic diamine. It has excellent chemical resistance; there are no known organic solvents for the film. Kapton® does not melt or burn as it has the highest UL-94 flammability rating: V-0. The outstanding properties of Kapton® permit it to be used at both high and low temperature extremes where other organic polymeric materials would not be functional.

Adhesives are available for bonding Kapton® to itself and to metals, various paper types, and other films.

Kapton® polyimide film can be used in a variety of electrical and electronic insulation applications: wire and cable tapes, formed coil insulation, substrates for flexible printed circuits, motor slot liners, magnet wired insulation, transformer and capacitor insulation, magnetic and pressure-sensitive tapes, and tubing. Many of these applications are based on the excellent balance of electrical, thermal, mechanical, physical, and chemical properties of Kapton® over a wide range of temperatures. It is this combination of useful properties at temperature extremes that makes Kapton® a unique industrial material.

Kapton® Substrate

Applicants have demonstrated that Kapton can be useful as a substrate film for super-lattice thermoelectric layers when high temperature use is not planned. Applicants have shown that a crystal layer laid down between the Kapton® substrate and the series of very thin conducting and barrier layers greatly improve thermoelectric performance especially for n-type layers. The preferred technique is to lay it on about 1000 Å thick in an amorphous form then to crystallize it by heating the substrate and the silicon layer to about 350° C. to 375° C. When Kapton® is used as a substrate it can be mounted on a crystalline base that can be sand blasted off the Kapton® after the thermoelectric film is deposited.

Other Substrates

Many other organic materials such as Mylar, polyethylene, and polyamide, polyamide-imides and polyimide compounds could be used as substrates. Other potential substrate materials are oxide films such as $SiO_2$, $Al_2O_3$ and $TiO_2$. Mica could also be used for substrate. As stated above, the substrate preferably should be very thin a very good thermal and electrical insulator with good thermal stability, strong and flexible.

While the above description contains many specificites, the reader should not construe these as limitations on the scope of the invention, but merely as exemplifications of preferred embodiments thereof. Those skilled in the art will envision many other possible variations within its scope. The preferred layer thickness is about 100 Angstroms; however, layer thickness could be somewhat larger or smaller such as within the range of 200 Angstroms down to 10 Angstroms. It is not necessary that the layers be grown on film. For example, they could be grown on thicker substrates that are later removed. There are many other ways to make the connections between the legs other than the methods discussed. Accordingly, the reader is requested to determine the scope of the invention by the appended claims and their legal equivalents, and not by the examples which have been given.

We claim:

1. A thermoelectric module comprised of:
   A) a plurality of n-legs comprised of very thin alternating layers of silicon and silicon germanium; and
   B) a plurality of p-legs comprised of very thin alternating layers of boron carbide comprise two different stoichiometric forms of boron carbide;
   said p-legs and said n-legs being electrically connected to produce said thermoelectric module.

2. A thermoelectric module as in claim 1, wherein said two different stoichiometric forms of boron carbide are $B_4C$ and $B_9C$.

3. A thermoelectric module as in claim 1, wherein said alternating layers are deposited on a substrate.

4. A thermoelectric module as in claim 3, wherein said substrate is silicon.

5. A thermoelectric module as in claim 3, wherein said substrate is silicon film.

6. A thermoelectric module as in claim 3, wherein said substrate is a polyimide substrate.

7. A thermoelectric element as in claim 1, wherein said very thin alternating layers are about 100 Angstroms thick.

8. A thermoelectric element as in claim 1, wherein said very thin alternating layers are each less than 200 Angstroms thick.

9. A thermoelectric element as in claim 1, wherein said very thin alternating layers are each less than 100 Angstoms thick.

10. A thermoelectric element as in claim 1, wherein said very thin alternating layers is about 3 million layers.

11. A thermoelectric element as in claim 1, wherein said very thin alternating layers more than 1 million layers.

12. A thermoelectric element as in claim 1, wherein of very thin alternating layers is at least 1250 layers.

13. A method of producing thermoelectric modules comprising the steps of:
   A) depositing on a thin substrate a very large number of very thin alternating layers of silicon and silicon germanium to form a Si/SiGe thermoelectric film;
   B) forming a stack of said Si/SiGe films produced as in step A),
   C) producing a plurality of Si/SiGe thermoelectric n-legs from said stacks of Si/SiGe films,
   D) depositing on a thin substrate a very large number of very thin alternating layers of $B_4C$ and $B_9C$ to form a $B_4C/B_9C$ thermoelectric film;
   E) forming a stack of said $B_4C/B_9C$ films produced as in step A),
   F) producing a plurality of $B_4C/B_9C$ thermoelectric p-legs from said stacks of $B_4C/B_9C$ films,
   G) forming a thermoelectric module from said plurality of Si/SiGe thermoelectric n-legs and said plurality of $B_4C/B_9C$ thermoelectric legs,
   said p-legs and said n-legs being electrically connected to produce said thermoelectric module.

* * * * *